US011133650B2

(12) United States Patent
Han et al.

(10) Patent No.: US 11,133,650 B2
(45) Date of Patent: Sep. 28, 2021

(54) BACK SIDE EMITTING LIGHT SOURCE ARRAY DEVICE AND ELECTRONIC APPARATUS HAVING THE SAME

(71) Applicant: SAMSUNG ELECTRONICS CO., LTD., Suwon-si (KR)

(72) Inventors: Seunghoon Han, Seoul (KR); Byunghoon Na, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 106 days.

(21) Appl. No.: 16/544,390

(22) Filed: Aug. 19, 2019

(65) Prior Publication Data

US 2020/0067278 A1 Feb. 27, 2020

Related U.S. Application Data

(60) Provisional application No. 62/721,083, filed on Aug. 22, 2018.

(30) Foreign Application Priority Data

Apr. 15, 2019 (KR) .......................... 10-2019-0043779

(51) Int. Cl.
*H01S 5/00* (2006.01)
*H01S 5/183* (2006.01)
(Continued)

(52) U.S. Cl.
CPC ...... *H01S 5/18377* (2013.01); *H01S 5/02345* (2021.01); *H01S 5/02415* (2013.01);
(Continued)

(58) Field of Classification Search
CPC ............. H01S 5/18377; H01S 5/18305; H01S 5/02345; H01S 5/02469; H01S 5/02476;
(Continued)

(56) References Cited

U.S. PATENT DOCUMENTS 6,410,347 B1 * 6/2002 Baek ...................... C30B 25/16
438/7
7,821,021 B2 * 10/2010 Yoo ........................ H01L 33/62
257/98
(Continued)

FOREIGN PATENT DOCUMENTS

KR  10-2017-0112915 A  10/2017
WO     2015/021255 A1   2/2015
WO     2017151846 A1    9/2017

OTHER PUBLICATIONS

Communication dated Mar. 16, 2020, issued by the European Patent Office in counterpart European Application No. 19192108.9.

*Primary Examiner* — Kinam Park
(74) *Attorney, Agent, or Firm* — Sughrue Mion, PLLC

(57) ABSTRACT

Provided is a back side emitting light source array device and an electronic apparatus, the back side emitting light source array device includes a substrate, a distributed Bragg reflector (DBR) provided on a first surface of the substrate, a plurality of gain layers which are provided on the DBR, the plurality of gain layers being spaced apart from one another, and each of the plurality of gain layers being configured to individually generate light, and a nanostructure reflector provided on the plurality of gain layers opposite to the DBR, and including a plurality of nanostructures having a sub-wavelength shape dimension, wherein a reflectivity of the DBR is less than a reflectivity of the nanostructure reflector such that the light generated is emitted through the substrate.

26 Claims, 16 Drawing Sheets

(51) Int. Cl.
*H01S 5/40* (2006.01)
*H01S 5/343* (2006.01)
*H01S 5/024* (2006.01)
*H01S 5/02345* (2021.01)

(52) U.S. Cl.
CPC ...... *H01S 5/02469* (2013.01); *H01S 5/18305* (2013.01); *H01S 5/18311* (2013.01); *H01S 5/18386* (2013.01); *H01S 5/343* (2013.01); *H01S 5/4025* (2013.01)

(58) Field of Classification Search
CPC .... H01S 5/02484; H01S 5/343; H01S 5/4025; H01S 5/02415; H01S 5/18386; H01S 5/18311
See application file for complete search history.

(56) References Cited

U.S. PATENT DOCUMENTS

| | | | |
|---|---|---|---|
| 7,903,712 B2* | 3/2011 | Sun | G01J 3/26 |
| | | | 372/46.014 |
| 9,324,919 B2* | 4/2016 | Lee | H01L 33/60 |
| 10,362,295 B2* | 7/2019 | Chen | G02B 27/646 |
| 2005/0243886 A1* | 11/2005 | Wang | H01S 5/18377 |
| | | | 372/98 |
| 2009/0262775 A1 | 10/2009 | Uchida et al. | |
| 2011/0241564 A1* | 10/2011 | Shimizu | H01S 5/18347 |
| | | | 315/291 |
| 2012/0051384 A1 | 3/2012 | Geske et al. | |
| 2015/0288146 A1 | 10/2015 | Chang-Hasnain et al. | |
| 2015/0340841 A1 | 11/2015 | Joseph | |
| 2016/0299337 A1 | 10/2016 | Arbabi et al. | |
| 2017/0287151 A1 | 10/2017 | Han et al. | |
| 2018/0129866 A1 | 5/2018 | Hicks et al. | |
| 2018/0322645 A1 | 11/2018 | Han et al. | |
| 2019/0041660 A1* | 2/2019 | Ahmed | G06K 9/00255 |
| 2019/0067909 A1* | 2/2019 | Ghosh | H01S 5/187 |
| 2019/0371965 A1* | 12/2019 | Na | G06T 7/521 |

* cited by examiner

BACK SIDE EMITTING LIGHT SOURCE ARRAY DEVICE AND ELECTRONIC APPARATUS HAVING THE SAME

CROSS-REFERENCE TO RELATED APPLICATION

This application claims the benefit of U.S. Provisional Application No. 62/721,083, filed on Aug. 22, 2018 in the United States Patent and Trademark Office, and Korean Patent Application No. 10-2019-0043779, filed on Apr. 15, 2019 in the Korean Intellectual Property Office, the disclosures of which are incorporated herein in their entireties by reference.

BACKGROUND

1. Field

Example embodiments of the present disclosure relate to a back side emitting light source array device that includes a plurality of vertical cavity surface emitting lasers (VCSELs) including nanostructure reflectors and emits light toward a substrate and an electronic apparatus including the back side emitting light source array device.

2. Description of the Related Art

In recent years, in object recognition with respect to, for example, humans and other objects, it is increasingly necessary to accurately identify the shape, position, and movement of an object through accurate 3-dimensional shape recognition. For example, a laser is often used for a sensor for 3-dimensional shape recognition.

Since a vertical cavity surface emitting laser (VCSEL) exhibits lower optical gain lengths than an edge emitting laser (EEL), the VCSEL is advantageous for reduction of power consumption and increased integration. Also, while the EEL exhibits asymmetrical optical output, the VCSEL provides a circular symmetrical output mode, and thus the VCSEL may be efficiently connected to an optical fiber and perform stable high-speed modulation at low noise.

The VCSEL includes a distributed Bragg reflector (DBR) exhibiting a high reflectivity of about 90% or higher to constitute a laser resonator. A DBR may include a stacked structure of tens of pairs of two materials with different refractive indices to obtain a high reflectivity. A DBR exhibits low heat conductivity (or high heat resistance) due to phonon scattering occurring at the boundary of two materials. There is a need for a technique and a method capable of improving light control and light emission characteristics while compensating for the disadvantages of the DBR.

SUMMARY

One or more example embodiments provide a back side emitting light source array device including a plurality of vertical cavity surface emitting lasers (VCSELs) and configured to emit light toward a substrate.

One or more example embodiments also provide an electronic apparatus including a back side emitting light source array device including a plurality of VCSELs.

Additional aspects will be set forth in part in the description which follows and, in part, will be apparent from the description, or may be learned by practice of example embodiments.

According to an aspect of an example embodiment, there is provided a back side emitting light source array device including a substrate, a distributed Bragg reflector (DBR) provided on a first surface of the substrate, a plurality of gain layers which are provided on the DBR, the plurality of gain layers being spaced apart from one another, and each of the plurality of gain layers being configured to individually generate light, and a nanostructure reflector provided on the plurality of gain layers opposite to the DBR, and including a plurality of nanostructures having a sub-wavelength shape dimension, wherein a reflectivity of the DBR is less than a reflectivity of the nanostructure reflector such that the light generated is emitted through the substrate.

The back side emitting light source array device may further include a meta-surface layer provided on a second surface of the substrate opposite to the first surface.

The meta-surface layer may include a meta lens, a meta-prism, or a meta-diffractive element.

The meta-surface layer may have sub-wavelength dimensions and may include a nanostructure with a refractive index that is greater than a reflective index of a material provided around the nanostructure.

At least one of a thickness, a width, and an arrangement pitch of each of the plurality of nanostructures of the nanostructure reflector may be less than or equal to half of wavelength of the light, and at least one of a thickness, a width, and an arrangement pitch of each of the plurality of nanostructures of the meta-surface layer may be less than or equal to two-thirds of the wavelength of the light.

The back side emitting light source array device may further include a heat sink provided on the nanostructure reflector opposite to the plurality of gain layers.

The substrate may include a group III-V semiconductor substrate.

A p contact layer may be provided in the nanostructure reflector and a p contact metal may be provided in the p contact layer.

The plurality of gain layers may be provided in an n×m matrix array, where n and m are natural numbers, and the p contact metal may be correspondingly provided to overlap two or more columns the n×m matrix array of the plurality of gain layers.

The back side emitting light source array device may further include an aperture layer provided on the p contact metal.

The back side emitting light source array device may further include an insertion layer provided on the aperture layer.

The back side emitting light source array device may further include an n contact layer provided between the DBR and the plurality of gain layers.

The back side emitting light source array device may further include dummy gain layers which do not generate light, and n contact metals supported by the dummy gain layers provided at both ends of the DBR, the n contact metals being connected to the n contact layer.

The plurality of gain layers may be provided in an n×m matrix array, n and m being natural numbers, and the n contact layer and the n contact metals are correspondingly provided to overlap two or more rows of the n×m matrix array of the plurality of gain layers.

The back side emitting light source array device may further include wires provided on the heat sink.

The back side emitting light source array device may further include bonding layers provided between the nanostructure reflector and the heat sink.

The back side emitting light source array device may further include a heat conduction layer provided between the nanostructure reflector and the heat sink.

The back side emitting light source array device may further include a p contact layer provided on the nanostructure reflector, an n contact layer provided between the DBR and the plurality of gain layers, and an insulating protection layer provided between the p contact layer and the n contact layer.

According to an aspect of an example embodiment, there is provided an electronic apparatus including a back side emitting light source array device configured to radiate light to a target object, a sensor configured to receive light reflected from the target object, and a processor configured to obtain information regarding the target object based on light received by the sensor, wherein the back side emitting light source array device includes a substrate, a distributed Bragg reflector (DBR) provided on a first surface of the substrate, a plurality of gain layers which are provided on the DBR, the plurality of gain layers being spaced apart from one another, and each of the plurality of gain layers being configured to individually generate light, and a nanostructure reflector provided on the plurality of gain layers opposite to the DBR, and including a plurality of nanostructures having a sub-wavelength shape dimension, wherein a reflectivity of the DBR is less than a reflectivity of the nanostructure reflector such that the light generated is emitted through the substrate.

The electronic apparatus may further include a meta-surface layer provided on second surface of the substrate opposite to the first surface.

The electronic apparatus may further include a heat sink provided on the nanostructure reflector.

The electronic apparatus may further include a p contact layer provided on the nanostructure reflector, and a p contact metal provided on the p contact layer.

The plurality of gain layers may be provided in an n×m matrix array, n and m being natural numbers, and the p contact metal is correspondingly provided to overlap two or more columns of the n×m matrix array of the plurality of gain layers.

The electronic apparatus may further include an n contact layer provided between the DBR and the plurality of gain layers.

The electronic apparatus may further include dummy gain layers which do not generate light, and n contact metals supported by the dummy gain layers provided at both ends of the DBR, the n contact metals being connected to the n contact layer.

The plurality of gain layers may be provided in an n×m matrix array, n and m being natural numbers, and the n contact layer and the n contact metals are correspondingly provided to overlap two or more rows of the n×m matrix array of the plurality of gain layers

BRIEF DESCRIPTION OF THE DRAWINGS

The above and/or other aspects will become apparent and more readily appreciated from the following description of example embodiments, taken in conjunction with the accompanying drawings in which.

DETAILED DESCRIPTION

Figure 1:
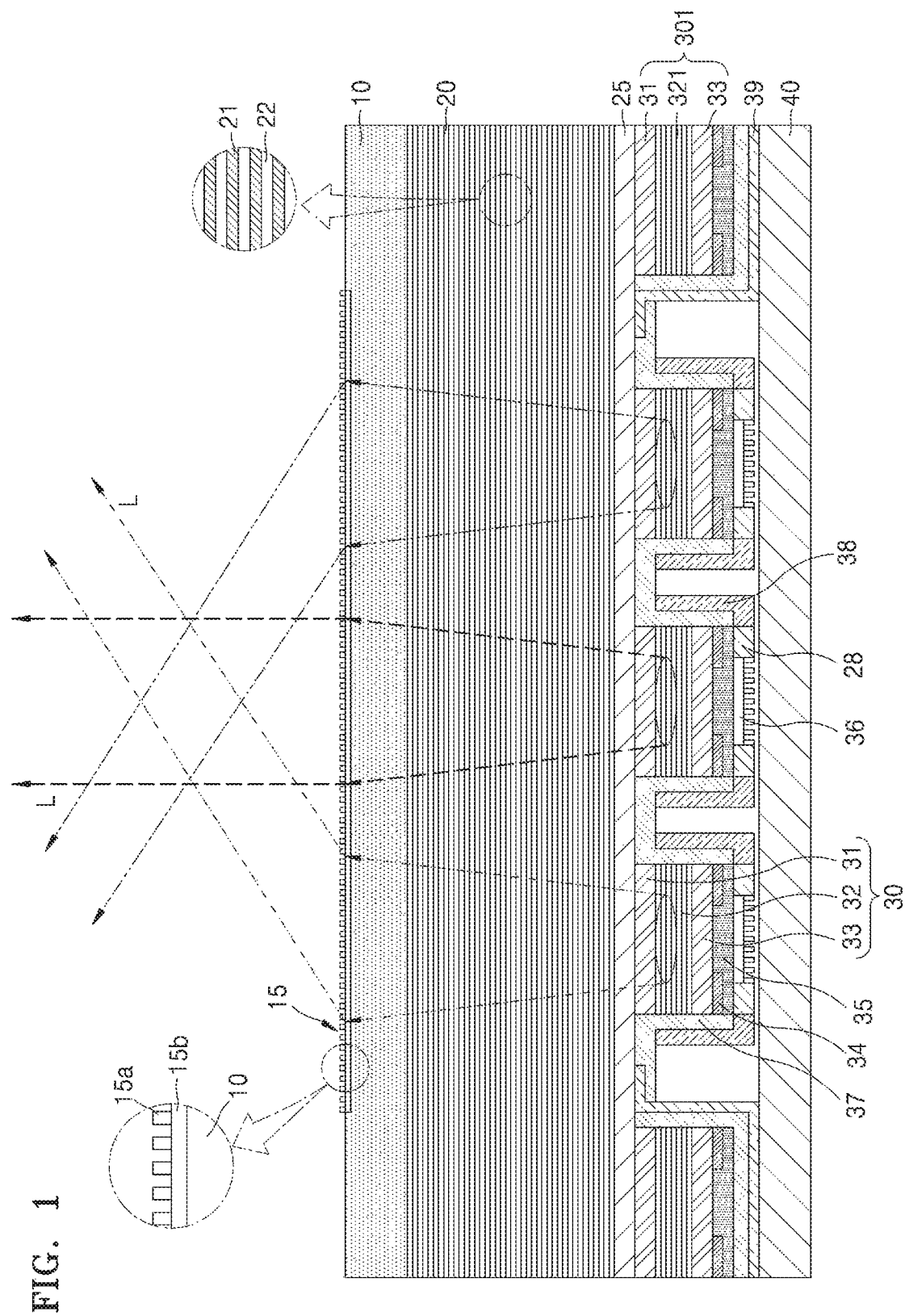
FIG. 1 is a schematic view of a back side emitting light source array device according to an example embodiment.

Reference will now be made in detail to example embodiments of which are illustrated in the accompanying drawings, wherein like reference numerals refer to like elements throughout. In this regard, the example embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

In the drawings, the size and thickness of each element may be exaggerated for clarity of explanation. While such terms as "first," "second," etc., may be used to describe various elements, such elements must not be limited to the above terms. The above terms may be used only to distinguish one element from another.

An expression used in the singular encompasses the expression of the plural, unless it has a clearly different meaning in the context. In addition, unless explicitly described to the contrary, the word "comprise" and variations such as "comprises" or "comprising" will be understood to imply the inclusion of stated elements but not the exclusion of any other elements. Also, when it is described that a certain material layer is present on a substrate or other layer, the material layer may be present in direct contact with the substrate or another layer, and there may be another third layer in between. In addition, the materials constituting layers in the following example embodiments are merely examples, and other materials may also be used.

In addition, the terms "unit", "-or", and "module" described in the specification mean units for processing at least one function and operation and may be implemented by hardware components or software components and combinations thereof.

The specific implementations described in example embodiments are illustrative and are not in any way limiting. For clarity of description, descriptions of conventional electronic configurations, control systems, software, and other functional aspects of such systems may be omitted. Also, connections of lines or connecting members between the components shown in the drawings are example illustrations of functional connections and/or physical or circuit connections, which may be replaced with or additionally provided by various functional connections, physical connections, or circuit connections.

The use of the terms "the" and similar indication words may refer to both singular and plural.

Operations that constitute a method may be performed in any suitable order, unless explicitly stated to be done in an order described. Furthermore, the use of all exemplary terms (e.g., etc.) is merely intended to be illustrative of technical ideas and is not to be construed as limiting the scope of the term unless further limited by the claims.

FIG. 1 is a schematic view of a back side emitting light source array device according to an example embodiment.

Referring to FIG. 1, the back side emitting light source array device may include a substrate 10, a distributed Bragg reflector (DBR) 20 provided on the substrate 10, a plurality of gain layers 30 that are arranged on the DBR 20 to be spaced apart from one another, and a plurality of nanostructure reflectors 36 that are provided to be respectively corresponding to the plurality of gain layers 30.

A heat sink 40 for emitting heat to the plurality of nanostructure reflectors 36 may be provided.

The substrate 10 may be a semiconductor substrate, e.g., a group III-V semiconductor substrate. However, example embodiments are not limited thereto.

The DBR 20, the plurality of gain layers 30, and the plurality of nanostructure reflector 36 may constitute a vertical cavity surface emitting laser (VCSEL). The VCSEL is a type of semiconductor laser diode that emits light in a direction perpendicular to the surface of a laser.

The DBR 20 may have a structure in which first material layers 21 and second material layers 22 having different refractive indexes are alternately and repeatedly stacked. The reflectivity of the DBR 20 may be adjusted by adjusting at least one of a difference between the refractive indexes of a first material layer 21 and a second material layer 22, the thicknesses of the first material layer 21 and the thickness of the second material layer 22, and the number of times that the first material layers 21 and the second material layers 22 are stacked. For example, the first material layers 21 and the second material layers 22 may each have a thickness of a quarter of a desired emission wavelength of light and be alternately and repeatedly stacked. The DBR 20 may include a material that is the same as or similar to a semiconductor material constituting the gain layer 30. For example, the first material layer 21 may be an $Al_xGa_{(1-x)}As$ layer (where x is 0≤X≤1), and the second material layer 22 may be an $Al_yGa_{(1-y)}As$ layer (where y is 0≤y≤1, x≠y), but example embodiments not limited thereto. The first material layer 21 and the second material layer 22 of the DBR 20 may be undoped layers, but in some examples, the first material layer 21 and the second material layer 22 may be doped layers of certain semiconductor types. The materials constituting the DBR 20 are not limited to those described above, and various materials capable of forming refractive index differences may be used for the first material layer 21 and the second material layer 22. The DBR 20 may be a type of a flat plate-like mirror layer and may have a plate-like structure to cover the plurality of gain layers 30. The DBR 20 may be considered as a common mirror layer for the plurality of gain layers 30.

The gain layer 30 is a layer configured to absorb energy to generate light. The gain layer 30 may generate light, for example, by injecting a current or by pumping light. The gain layer 30 may include an active layer 32 including a semiconductor material. The active layer 32 may include, for example, a group III-V semiconductor material or a group II-VI semiconductor material. For example, the active layer 32 may include a multi-quantum well (MQW) structure including indium gallium arsenide (InGaAs), aluminum gallium arsenide (AlGaAs), aluminum gallium nitride (AlGaN), indium gallium arsenide phosphide (InGaAsP), indium gallium phosphide (InGaP), or aluminum gallium indium phosphide (AlGaInP). According to an example embodiment, the active layer 32 may include quantum dots. The materials and the configurations of the active layer 32 are not limited thereto and may vary. A first clad layer 31 and a second clad layer 33 may be further provided below and above the active layer 32. The first clad layer 31 and the second clad layer 33 may each include an n-type semiconductor material, a p-type semiconductor material, or an intrinsic semiconductor material. The first clad layer 31 and the second clad layer 33 may include the same semiconductor material as the active layer 32 and may further include an n-type dopant or a p-type dopant.

The nanostructure reflectors 36 may be arranged in correspondence to the plurality of gain layers 30, respectively. The nanostructure reflector 36 and the DBR 20 may emit light generated by the gain layer 30 to amplify and output light of a particular wavelength band. For light amplification, the reflectivity of the DBR 20 and the nanostructure reflector 36 may be set to about 90% or higher. For example, the reflectivity of the DBR 20 and the nanostructure reflector 36 may be set to 98% or higher. In an example embodiment, light generated by the gain layer 30 may resonate between the DBR 20 and the nanostructure reflector 36 and then be emitted through the substrate 10. For example, the DBR 20 may be configured to have a reflectivity lower than that of the nanostructure reflector 36, and thus light repeatedly reflected between the DBR 20 and the nanostructure reflector 36 may be emitted to the outside through the DBR 20 and the substrate 10. Therefore, a back side emitting light source array device may be implemented. The reflectivity of the DBR 20 may be adjusted by changing the compositions and thicknesses of the first material layer 21 and the second material layer 22 and the number of times that the first material layer 21 and the second material layer 22 are stacked. The reflectivity of the nanostructure reflector 36 may be adjusted by changing the materials constituting a nanostructure 36a and a supporting layer 36b, the size of the nanostructure 36a, and the arrangement scheme of the nanostructure 36a, for example.

Figure 2:
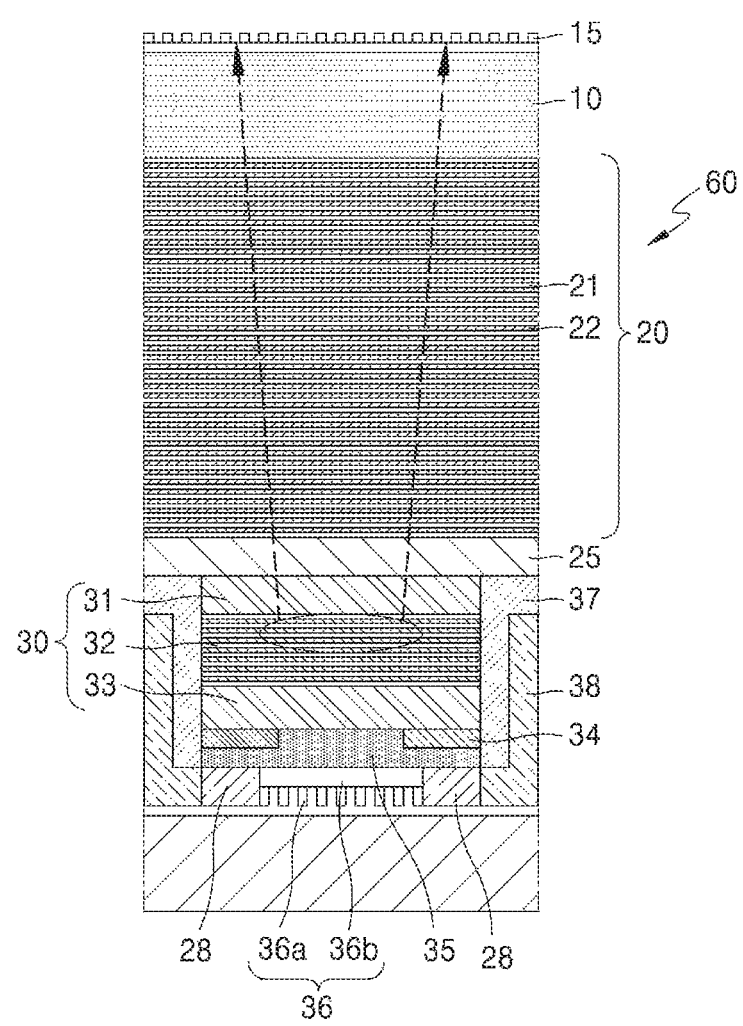
FIG. 2 is a view of a vertical cavity surface emitting laser (VCSEL) of the back side emitting light source array device shown in FIG. 1.

FIG. 2 is an enlarged view of the VCSEL in FIG. 1. Referring to FIG. 2, the nanostructure reflector 36 may include a plurality of nanostructures 36a having a sub-wavelength dimension. Here, the sub-wavelength dimension may be a thickness or a width, which is a dimension defining the shape of the nanostructure 36a, smaller than the operating wavelength of the nanostructure reflector 36. The operating wavelength of the nanostructure reflector 36 may be within the wavelength band of light generated by the gain layer 30 and may indicate the wavelength λ of light L emitted and emitted between the DBR 20 and the nanostructure reflector 36 in light generated by the gain layer 30. This may be an emission wavelength λ.

The nanostructure 36a includes a material having a refractive index higher than those of surrounding materials (e.g., the air) and may be configured to reflect light of a certain wavelength band based on dimensions, particular shapes, and arrangement schemes. The nanostructure 36a may have a type of meta-structure. The nanostructure 36a may have a meta-structure when at least one of the thickness, the width, and an arrangement pitch of the nanostructure 36a it is equal to or less than ½ of the emission wavelength λ. For example, when the width of the nanostructure 36a is less than or equal to ½ of the emission wavelength λ, the nanostructure 36a may operate as a scattering unit, and as the arrangement pitch becomes less than the emission wavelength λ, light incident on the nanostructure 36a may be controlled to have a desired shape without high order diffraction. For example, when the thickness of the nanostructure 36a may be less than or equal to ½ of the emission wavelength λ, the nanostructure 36a may exhibit a relatively high reflectivity. However, the thickness of the nanostructure 36a is not limited thereto.

The nanostructure 36a may include a dielectric or semiconductor material. For example, the nanostructure 36a may include any one of a monocrystalline silicon (Si), a polycrystalline Si, an amorphous Si, silicon nitride ($Si_3N_4$), gallium phosphide (GaP), titanium dioxide ($TiO_2$), aluminum antimonide (AlSb), aluminum arsenide (AlAs), aluminum gallium arsenide (AlGaAs), aluminum gallium indium phosphide (AlGaInP), boron phosphide (BP), and zinc germanium diphosphide ($ZnGeP_2$). Alternatively, the nanostructure 36a may include a conductive material. As the conductive material, a highly conductive metal material capable of causing surface plasmon excitation may be employed. For example, at least one selected from copper (Cu), aluminum (Al), nickel (Ni), iron (Fe), cobalt (Co), zinc (Zn), titanium (Ti), ruthenium (Ru), rhodium (Rh), palladium (Pd), platinum (Pt), silver (Ag), osmium (Os), iridium (Ir), and gold (Au) may be employed as the conductive material or an alloy including any one of the above-stated metals may be employed as the conductive material. Furthermore, a 2-dimensional material having good conductivity like graphene or a conductive oxide may be employed. Alternatively, a part of the nanostructures 36a may include a dielectric material having a high refractive index, and the remaining of the nanostructures 36a may include a conductive material.

The nanostructure reflector 36 may include the supporting layer 36b supporting the plurality of nanostructures 36a. The supporting layer 36b may include a material having a refractive index smaller than the refractive index of the nanostructure 36a. For example, the supporting layer 36b may include $SiO_2$, a transparent conductive oxide (TCO), or a polymer like polycarbonate (PC), polystyrene (PS), or polymethyl methacrylate (PMMA). The materials constituting the supporting layer 36b are not limited thereto, and in some cases, the supporting layer 36b may include a semiconductor material. The supporting layer 36b and the nanostructure 36a may include the same or similar semiconductor material. For example, both the supporting layer 36b and the nanostructure 36a may include group III-V semiconductor compounds. Furthermore, by adjusting the composition ratio of the compounds, the refractive index of the supporting layer 36b may be made smaller than the refractive index of the nanostructure 36a. A difference between refractive indexes of the supporting layer 36b and the nanostructure 36a may be about 0.5 or more.

The second clad layer 33 of the gain layer 30 may further include an aperture layer 34 for adjusting the mode or the beam size of emitted light. The aperture layer 34 may include a certain oxide. Here, the aperture layer 34 is illustrated as being formed under the gain layer 30, but example embodiments are not limited thereto. For example, the aperture layer 34 may be disposed on top of the gain layer 30. In addition, a plurality of aperture layers 34 may be provided or may be omitted. The aperture layer 34 may further include an insertion layer 35. The insertion layer 35 may include the same type or similar type of semiconductor materials as the gain layer 30. The insertion layer 35 may be doped with a certain impurity.

When applied to a three-dimensional shape recognition sensor, the VCSEL may emit a laser beam of approximately 850 nm or 940 nm or may emit light in the near-infrared wavelength band. However, the wavelength of emitted light is not particularly limited, and light of a wavelength band needed for an application utilizing structured light may be emitted or light of a wavelength band needed for an application utilizing scan light may be emitted.

A first contact layer 25 may be provided between the DBR 20 and the gain layer 30. The first contact layer 25 may be provided to be corresponding to each of the plurality of gain layers 30. For example, when the gain layers 30 are arranged in the form of an n×m (n and m are natural numbers) matrix array, the first contact layer 25 may be provided to be corresponding to the gain layer 30 arranged in any one row in common. According to an example embodiment, the first contact layer 25 may be provided to be corresponding to the gain layers 30 arranged in two or more rows in common. First contact layers 25 adjacent to each other may be spaced apart.

Figure 3:
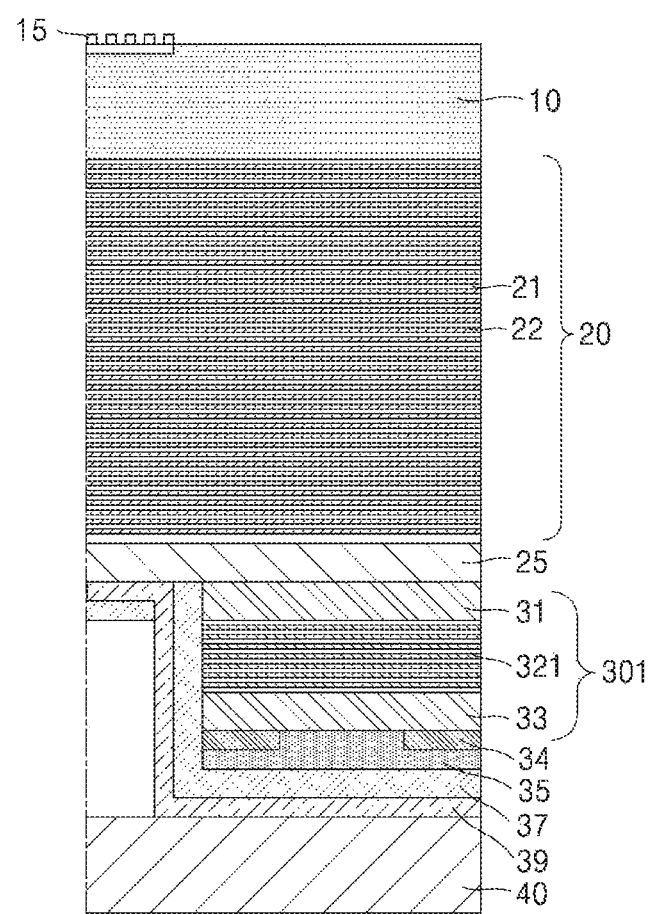
FIG. 3 is a view of a structure including a dummy gain layer of the back side emitting light source array device shown in FIG. 1.

Referring to FIG. 1, dummy gain layers 301 including dummy active layers 321 that do not generate light may be further provided at both ends of the DBR 20. FIG. 3 is an enlarged view of the dummy gain layer 301. Referring to FIG. 3, the dummy gain layer 301 may include a first clad layer 31 and a second clad layer 33. The dummy gain layer 301 may be configured, such that no voltage is applied thereto to generate light. A first contact metal 39 for applying a voltage to the first contact layer 25 may be provided in the dummy gain layer 301. The first contact metal 39 may be supported by the dummy gain layer 321 and may extend to the first contact layer 25 and be electrically coupled thereto.

For example, the first contact layer 25 may be an n contact layer and the first contact metal 39 may be an n contact metal. However, example embodiments are not limited thereto, and the first contact layer 25 may be a p contact layer and the first contact metal 39 may be a p contact metal. The first contact layer 25 may include a transparent conductive material through which light may be transmitted. A second contact layer 28 may be provided on the other surface of the gain layer 30. A second contact metal 38 for applying a voltage to the second contact layer 28 may be provided. For example, the second contact layer 28 may be a p contact layer and the second contact metal 38 may be a p contact metal. The second contact layer 28 may be provided adjacent to the nanostructure reflector 36. Since the second contact layer 28 is not connected to the second contact metal 38, no voltage is supplied to the dummy gain layer 301, and thus no light is generated.

An insulating protection layer 37 for electrical isolation may be further provided between the first contact layer 25 and the second contact metal 38 or between the first contact layer 25 and the second contact layer 28. When the gain layers 30 are arranged in the form of an n×m (n and m are natural numbers) matrix array, the second contact metal 38 may be coupled to the second contact layers 28, which are provided in correspondence to the gain layers 30 arranged in any one row, in common. Furthermore, the second contact layers 28 provided in each column may be arranged to be apart from one another. An electrical wiring structure will be described later.

When power is turned on through the first contact metal 39 and the second contact metal 38, light is generated by the gain layer 30. The light may be resonated between the DBR 20 and the nanostructure reflector 36 and emitted to the outside through the substrate 10.

Referring to FIG. 1, a meta-surface layer 15 may be further provided on the other surface of the substrate 10. The meta-surface layer 15 may include a meta-lens, a meta-prism, or a meta-diffractive element.

The meta-surface layer 15 may have sub-wavelength dimensions and may include nanostructures 15a having a relatively high refractive index and a material having a relatively low refractive index around the nanostructures 15a. The nanostructures 15a may be provided on the supporting layer 15b. For example, at least one of the thickness, the width, and the arrangement pitch of the nanostructures 36a of the nanostructure reflector 36 has a numerical value less than or equal to half of the wavelength of light, and at least one of the thickness, the width, and the arrangement pitch of the nanostructures 15a of the meta-surface layer 15 may have a numerical value equal to or less than two-thirds of the wavelength of light. However, it is merely an example, and example embodiments are not limited thereto.

The nanostructures 15a may include a dielectric or semiconductor material. For example, the nanostructures 15a may include any one of a monocrystalline silicon, a polycrystalline Si, an amorphous Si, $Si_3N_4$, GaP, $TiO_2$, AlSb, AlAs, AlGaAs, AlGaInP, BP, and $ZnGeP_2$. According to an example embodiment, the nanostructures 15a may include a conductive material. As the conductive material, a highly conductive metal material capable of causing surface plasmon excitation may be employed. For example, at least one selected from Cu, Al, Ni, Fe, Co, Zn, Ti, Ru, Rh, Pd, Pt, Ag, Os, Ir, and Au may be employed as the conductive material or an alloy including any one of the above-stated metals may be employed as the conductive material. Furthermore, a two-dimensional material having good conductivity like graphene or a conductive oxide may be employed. According to an example embodiment, some of the nanostructures 15a may include a dielectric material having a relatively high refractive index, and the rest of the nanostructures 15a may include a conductive material.

The supporting layer 15b may include a material having a refractive index smaller than the refractive index of the nanostructure 15a. For example, the supporting layer 15b may include $SiO_2$, a transparent conductive oxide (TCO), or a polymer like polycarbonate (PC), polystyrene (PS), or polymethyl methacrylate (PMMA). The materials constituting the supporting layer 15b are not limited thereto, and in some cases, the supporting layer 15b may include a semiconductor material. The supporting layer 15b and the nanostructure 15a may include the same or similar semiconductor material. For example, both the supporting layer 15b and the nanostructure 15a may include group III-V semiconductor compounds. Furthermore, by adjusting the composition ratio of the compounds, the refractive index of the supporting layer 15b may be made smaller than the refractive index of the nanostructure 15a. A difference between refractive indexes of the supporting layer 15b and the nanostructure 15a may be about 0.5 or more. However, example embodiments are not limited thereto.

Figure 4:
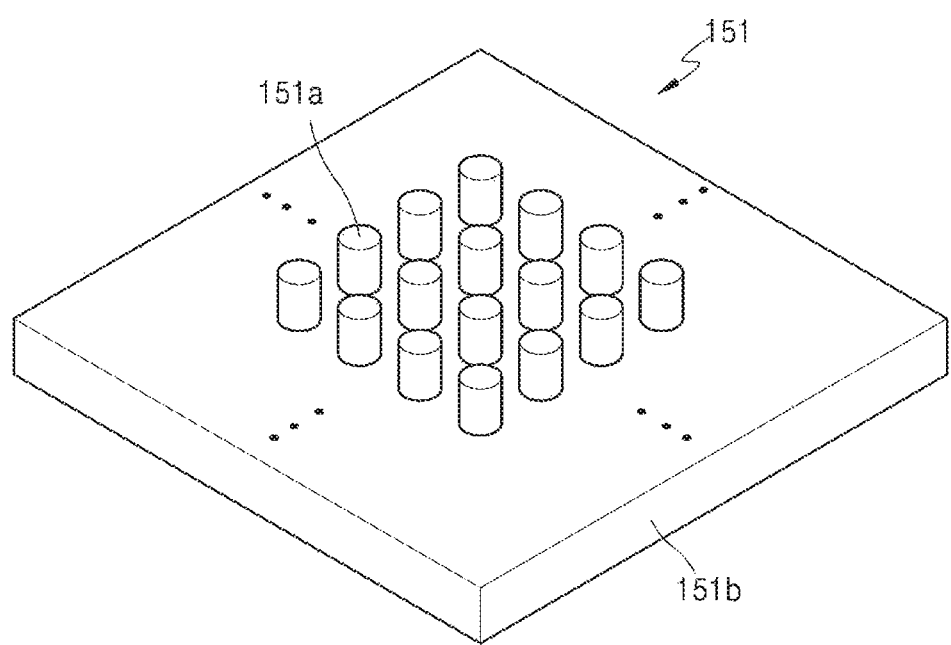
FIG. 4 is a view of an example of a nanostructure of a meta-surface layer of the back side emitting light source array device shown in FIG. 1.

FIG. 4 is a perspective view of an example of the meta-surface layer in FIG. 1.

Referring to FIG. 4, the meta-surface layer 151 may include the supporting layer 151b and a plurality of nanostructures 151a provided on the supporting layer 151b. FIG. 4 shows an example in which the nanostructures 151a are arranged in a rectangular lattice-like shape, but example embodiments are not limited thereto. The nanostructure 151a may have any of various shapes like a cylindrical shape, an elliptical column-like shape, and a rectangular column-like shape. Here, the case where the nanostructure 151a has a cylindrical shape is shown. The nanostructures 151a may be arranged, for example, in a radial shape.

Figure 5:
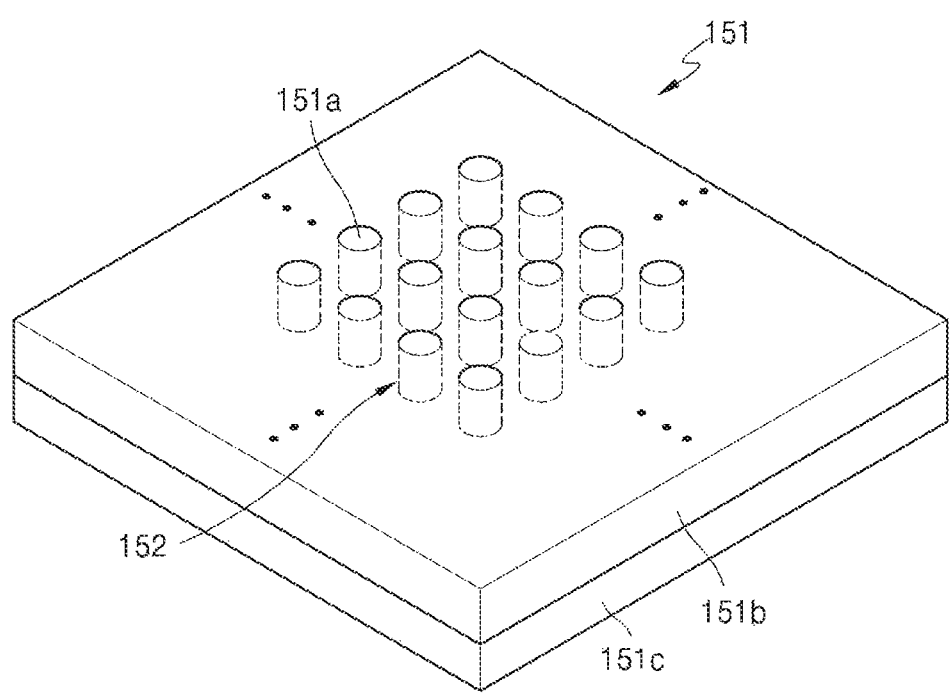
FIG. 5 is a view of another example of the nanostructure of the meta-surface layer of the back side emitting light source array device shown in FIG. 1.

FIG. 5 is a cross-sectional view of another example of a meta-surface layer in FIG. 1.

Referring to FIG. 5, a meta-surface layer 151 may include the supporting layer 151b and a plurality of nanostructures 151a provided in the supporting layer 151b. FIG. 5 shows an example in which the nanostructures 151a are arranged in a rectangular lattice-like shape. In addition, the nanostructures 151a may also be arranged in a hexagonal lattice-like shape, and the arrangement shape may vary. Further, the meta-surface layer 151 may include another supporting layer 151c.

Figure 6:
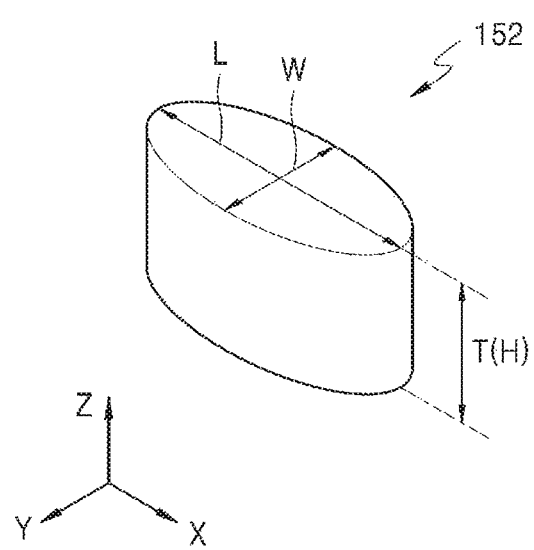
FIGS. 6 to 12 are views of various examples of the nanostructure of the meta-surface layer of the back side emitting light source array device shown in FIG. 1.

FIG. 6 is a perspective view of the structure of a nanostructure that may be applied to another example of a meta-surface layer.

Referring to FIG. 6, a nanostructure 152 may have a major axis in a first direction, e.g., an X-axis direction on an XY plane, and a minor axis in a second direction, e.g., a Y-axis direction. The dimension in the major axis direction may be referred to as a length L, whereas the dimension in the minor axis direction may be referred to as a width W. On the other hand, the dimension in a Z-axis direction may be referred to as a thickness T or a height H. The length L may be greater than the width W, and the nanostructure 152 may have an elliptical shape or a shape similar thereto on the XY plane. It may be said that the nanostructure 152 has an anisotropic structure.

The width W, the length L, and/or the thickness T of the nanostructure 152 may be less than or equal to half of the emission wavelength λ. Also, when the nanostructures 152 are arranged regularly, an interval between two nanostructures 152 adjacent to each other, for example, an interval between the centers of the two nanostructures 152 may be equal to or less than two-thirds of the emission wavelength λ.

The anisotropic structure of the nanostructure 152 may vary widely. For example, the nanostructure 152 may have an anisotropic structure other than an elliptical shape on the XY plane. Examples thereof are shown in FIGS. 7 and 8.

Figure 7:
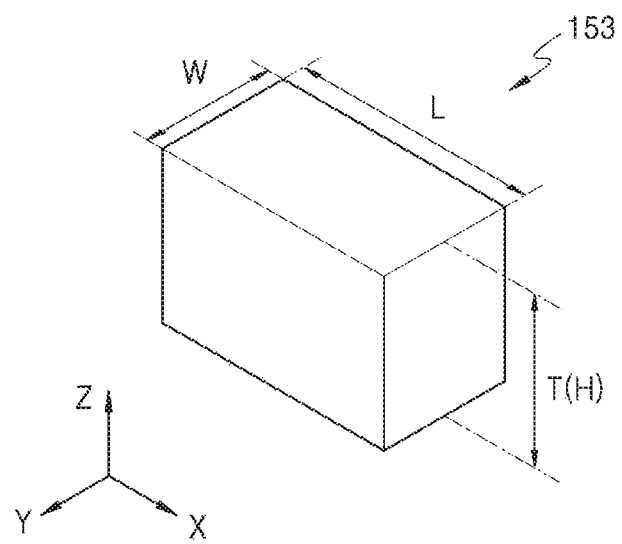

Referring to FIG. 7, the nanostructure 153 may have a rectangular column-like shape. The nanostructure 153 may have a rectangular anisotropic structure on the XY plane.

Figure 8:
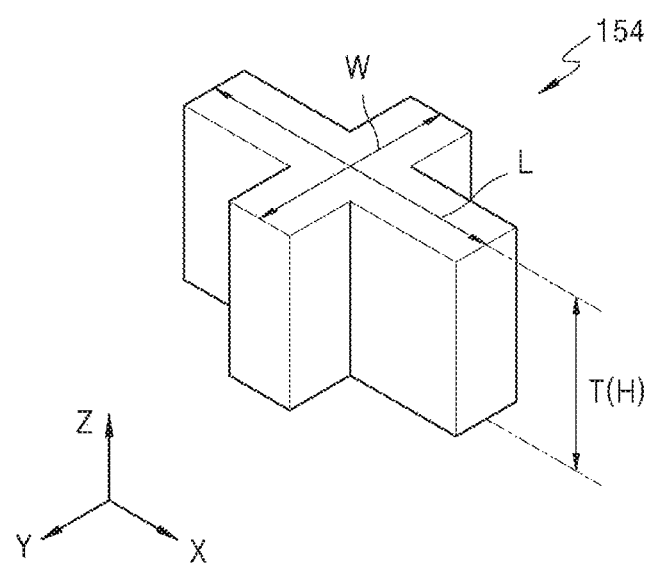

Referring to FIG. 8, the nanostructure 154 may have a cross-shaped column structure. At this time, the length L in the X-axis direction may be greater than the width W in the Y-axis direction. Therefore, it may be said that the nanostructure 154 has an anisotropic structure.

As described above with reference to FIGS. 6 to 8, when the nanostructures 152, 153, and 154 have anisotropic structures, the polarization direction of light incident on the nanostructures 152, 153, and 154 may be controlled by using arrays of the nanostructure 152, 153, and 154. By arranging the nanostructures 152, 153 and 154 having anisotropic structures in a particular direction, light incident on the nanostructures 152, 153, and 154 may be controlled to be polarized in a particular direction. However, the structures of the nanostructure 152, 153, and 154 are merely examples, and various modifications may be made therein.

According to example embodiments, the meta-surface layer 15 may be designed to be used as a meta-lens, a meta-prism, or a meta-diffractive element. The size distribution and the arrangement rule of a plurality of nanostructures constituting the meta-surface layer 15 may be designed, such that the meta-surface layer 15 serves as a concave lens, a convex lens, a prism, or a diffractive element.

Figure 9:
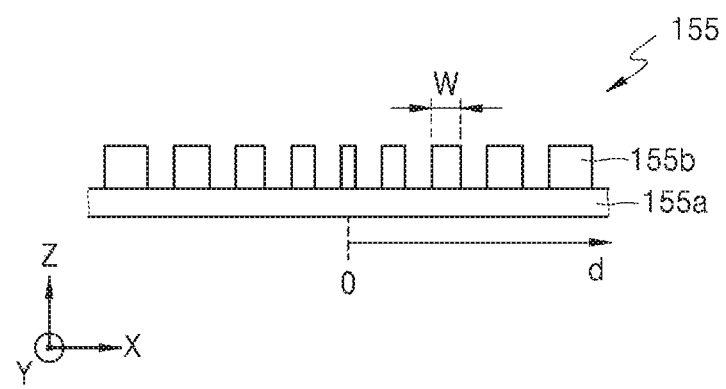

FIG. 9 is a cross-sectional view of a schematic structure of a nanostructure of a meta-surface layer according to another example embodiment.

Referring to FIG. 9, a meta-surface layer 155 may include a supporting layer 155a and a plurality of nanostructures 155b provided on the supporting layer 155a. The size distribution and the arrangement rule of a plurality of nanostructures 155b may be designed, such that the meta-surface layer 155 serves as a concave lens. For example, the width W of the plurality of nanostructures 155b may increase as a distance d from the center of the meta-surface layer 155 increases. When the position of the nanostructure 155 is defined as the distance d from the center of the meta-surface layer 155, the width W of the nanostructure 155b at a given position may be set to a particular value, such that the meta-surface layer 155 operates as a concave lens or a convex lens. As the distance d from the center of the meta-surface layer 155 increases, the width W of the nanostructure 155b may increase.

In another example, the variation rule of the width W of the nanostructure 155 described in FIG. 9 may be repeated. An example thereof is shown in FIG. 10.

Figure 10:
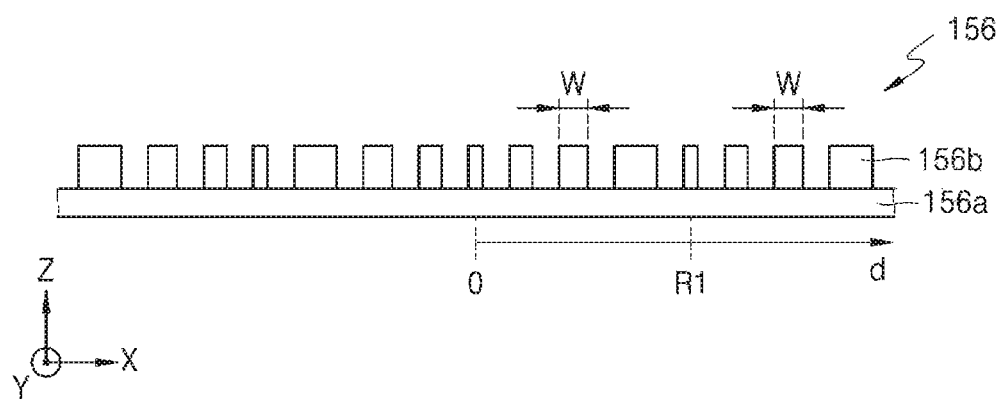

Referring to FIG. 10, a meta-surface layer 156 may include a supporting layer 156a and a plurality of nanostructures 156b, wherein the width W of the plurality of nanostructures 156b may increase in a direction away from the center of the meta-surface layer 156 according to a certain rule. The meta-surface layer 156 may be divided into a plurality of regions according to distances in the direction away from a center O, and the width W of the plurality of nanostructures 156b in the plurality of regions may increase in the direction away from the center O. Here, the case where the width W increases from the center (d=0) to a position R1 and the width W increases again as the distance d increases from the position R1. A period in which the rule of increasing the width W is repeated may vary. The meta-surface layer 156 may serve as a concave lens or a convex lens.

When the meta-surface layers 155 and 156 serves as a concave lens or convex lens, light emitted from one or more VCSELs may have a particular shape and a particular intensity distribution on a space of interest. By setting the focal distances of the meta-surface layers 155 and 156 that serve as concave lenses or convex lenses close to emission surfaces of VCSELs, light beams emitted from the VCSELs may be emitted at different angles with particular degrees of divergence or collimation. Accordingly, an illumination pattern on a space of interest may be adjusted. Also, by using methods to be described below with reference to FIGS. 13 to 17, a plurality of VCSELs may be sequentially driven one or a few at a time according to the time for illumination for scanning a space of interest as desired according to the time.

The optical characteristics of the meta-surface layers 155 and 156 may be controlled by adjusting the size distribution and the arrangement rule of a plurality of nanostructures constituting the meta-surface layers 155 and 156, and thus beam forming and beam shaping of emitted light may be possible.

Figure 11:
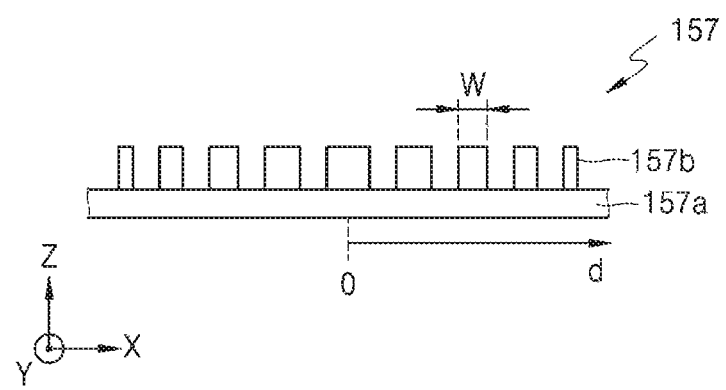

FIG. 11 is a cross-sectional view of a schematic structure of a meta-surface layer according to another example embodiment.

Referring to FIG. 11, a meta-surface layer 157 may include a supporting layer 157a and a plurality of nanostructures 157b provided on the supporting layer 157a. The size distribution and the arrangement rule of a plurality of nanostructures 157b may be designed, such that the meta-surface layer 155 serves as a concave lens or a convex lens. For example, the width W of the plurality of nanostructures 157b may decrease as a distance d from the center of the meta-surface layer 157 increases. As the distance d from the center O of the meta-surface layer 157 increases, the width W of the nanostructure 157b may increase.

The variation rule of the width W of the nanostructure 157b described above with reference to FIG. 11 may be repeated. An example thereof is shown in FIG. 12.

Figure 12:
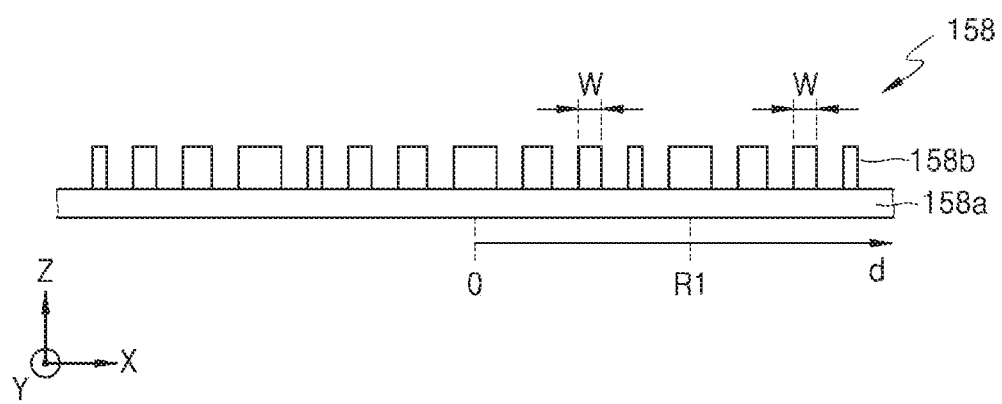

Referring to FIG. 12, a meta-surface layer 158 may include a supporting layer 158a and a plurality of nanostructures 158b, wherein the width W of the plurality of nanostructures 158b may decrease in a direction away from the center O of the meta-surface layer 158 according to a certain rule. The meta-surface layer 158 may be divided into a plurality of regions according to distances in the direction away from a center O, and the width W of the plurality of nanostructures 158b in the plurality of regions may decrease in the direction away from the center O. A period in which the rule of decreasing the width W is repeated may vary. The meta-surface layer 158 may serve as a convex lens or a concave lens. In a manner similar to that described above with reference to FIG. 10, a space of interest may be illuminated in various ways.

The dimensions and the arrangement of a plurality of nanostructures may be set, such that a meta-surface layer is configured to deflect incident light. The arrangement rule and the size distribution of a plurality of nanostructures may be set, such that the width or the size of the plurality of nanostructures gradually decreases or increases in one direction, for example, a horizontal direction. Also, a corresponding arrangement may be repeated on a 2-dimensional surface as one period unit. According to an example embodiment, the width and the size of a plurality of nanostructures may be randomly set in one direction, for example, a horizontal direction. The meta-surface layer 15 may be employed in a VCSEL, may be variously adjusted to control the optical performance of emitted light, e.g., a beam diameter, convergence/divergence/collimation shapes, and orientation, and may also be adjusted to control polarization direction of the emitted light. Meanwhile, the nanostructures described above with reference to FIGS. 4 to 12 may also be applied to the nanostructure reflector 36.

Figure 13:
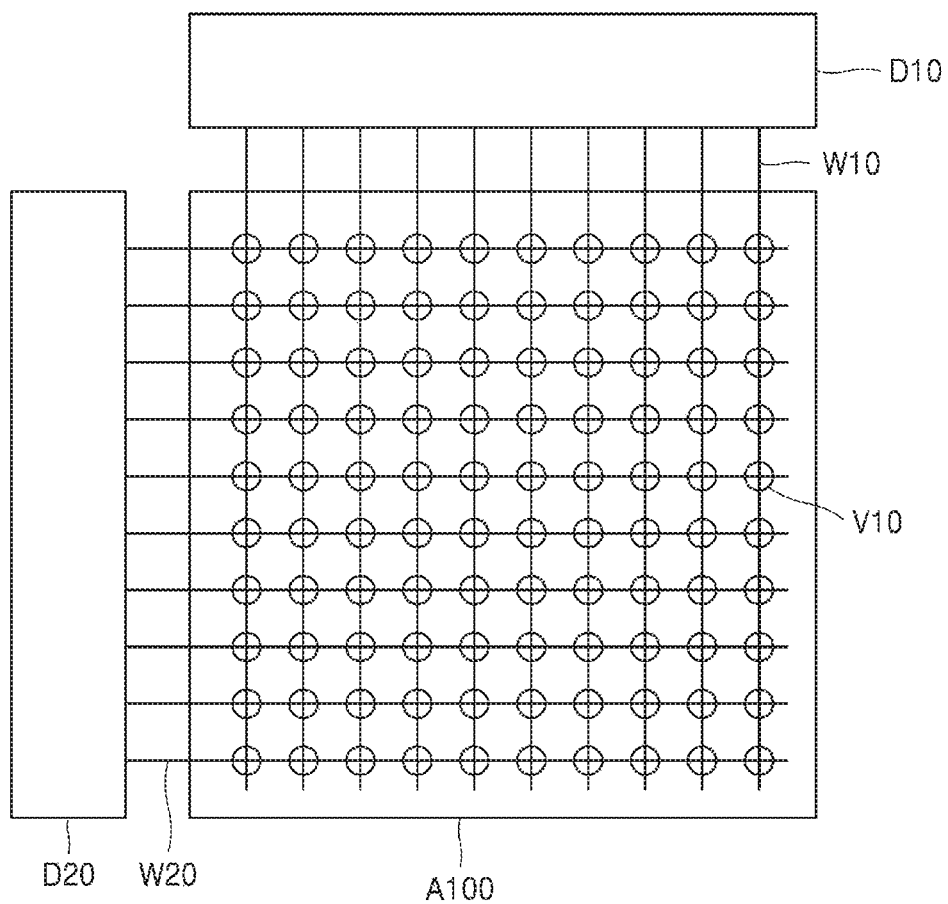
FIG. 13 is a schematic view of a wiring structure of a back side emitting light source array device according to an example embodiment.

FIG. 13 is a schematic plan view of a wiring structure of a back side emitting light source array device according to an example embodiment.

Referring to FIG. 13, a back side emitting light source array device may include an active area A100 in which a plurality of VCSELs V10 are arranged. The active area A100 may include a plurality of first wires W10 and a plurality of second wires W20 electrically connected to the plurality of VCSELs V10. For example, the first wires W10 may correspond to first contact metals, and the second wires W20 may correspond to second contact metals. The back side emitting light source array device may further include a first driver D10 electrically connected to the plurality of first wires W10 and a second driver D20 electrically connected to the plurality of second wires W20. When a voltage is applied to any one of the first wires W10 by the first driving unit D10 and a voltage is applied to any one of the second wires W20 by the second driving unit D20, light may be emitted by a VCSEL at a point where a first wire W10 and a second wire W20 to which voltages are applied. In an example embodiment, the first wires W10 and the second wires W20 may be provided in a heat sink 40 (in FIG. 1).

Figure 14:
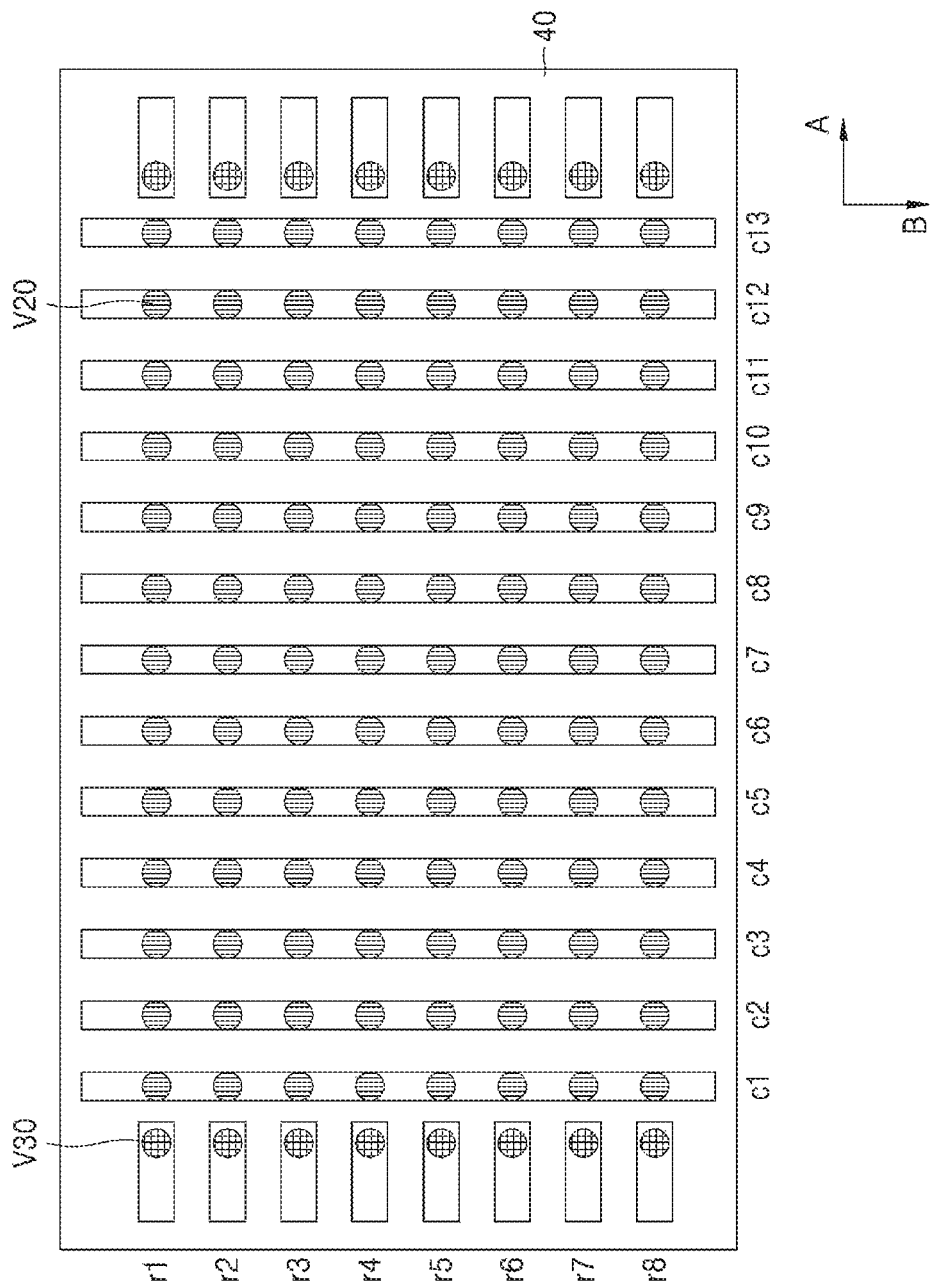
FIG. 14 is a schematic view of an example of a wiring structure of a back side emitting light source array device according to an example embodiment.

FIG. 14 is a schematic plan view of a wiring structure of a back side light emitting array according to an example embodiment.

Referring to FIG. 14, a plurality of first contact metal patterns r1 to r8 extending in a first direction (A direction) and a plurality of second contact metal patterns c1 to c13 extending in a second direction (B direction) intersecting the first direction (A direction) may be provided in the heat sink 40. The plurality of first contact metal patterns r1 to r8 may be arranged to be apart from one another. The plurality of second contact metal patterns c1 to c13 may be arranged to be apart from one another. The plurality of first contact metal patterns r1 to r8 may be row wires, whereas the plurality of second contact metal patterns c1 to c13 may be column wires. Each of the first contact metal patterns r1 to r8 may include a first contact layer 25 (in FIG. 1) and a first contact metal 39 (in FIG. 1). Each of the second contact metal patterns c1 to c13 may include a second contact layer 28 (in FIG. 1) and a second contact metal 38 (in FIG. 1). The number of the plurality of first contact metal patterns r1 to r8 and the number of the plurality of second contact metal patterns c1 to c13 are merely examples and may vary. VCSELs V20 may be disposed at points where the plurality of first contact metal patterns r1 to r8 and the plurality of second contact metal patterns c1 to c13 intersect. Dummy gain layers V30 may be provided on both sides of the plurality of first contact metal patterns r1 to r8.

The VCSEL V20 may be operated in either individually (two dimensional operation) or line-by-line (one-dimensional operation) according to a cathode operating point and an anode operating point. For example, when the VCSELs V20 are indicated as matrixes, a VCSEL (1,1) is turned on when power is applied to a first contact metal pattern r1 and a second contact metal pattern c1 and a VCSEL (2,1) is turned on when power is applied to the first contact metal pattern r1 and a second contact metal pattern c2. Accordingly, the VCSELs V20 may be driven individually and controlled two-dimensionally. The VCSELs V20 may be operated line-by-line and driven one-dimensionally. For example, when a first row of the first contact metal pattern r1 is turned on and the second contact metal patterns c1-c13 are selectively turned on and off simultaneously, the first row of the contact metal pattern r1 may be operated. When a second row of a first contact metal pattern r2 is turned on and the second contact metal patterns c1-c13 are selectively turned on and off simultaneously, the second row of the contact metal pattern r2 may be operated. When the first contact metal patterns r1 to r8 may be selectively turned on and off simultaneously and a first column of the second contact metal pattern c1 is turned on, the first column of the second contact metal pattern may be operated. When the first contact metal patterns r1 to r8 may be selectively turned on and off simultaneously and a second column of the second contact metal pattern c2 is turned on, the second column of the second contact metal pattern c2 may be operated. Accordingly, line-by-line emission control may be performed.

A method of operating a back side emitting light source array device shown in FIG. 14 will be described below.

An individual VCSEL operation method is performed as VCSEL(1,1) ON: r1 ON and c1 ON, VCSEL(1,2) ON: r1 ON and c2 ON, . . . , VCSEL(8,13) ON: r8 ON and c13 ON. A line-by-line VCSEL operation method is performed as VCSEL(1 row) ON: r1 ON and c1~c13 ON, VCSEL(2 row) ON: r2 ON and c1~c13 ON, . . . , VCSEL(8 row) ON: r8 ON and c1~c13 ON. Another line-by-line VCSEL operation method is performed as VCSEL(1 column) ON: r1~r8 ON and c1 ON, VCSEL(2 column) ON: r1~r8 ON and c2 ON, . . . , VCSEL(13 column) ON: r1~r8 ON and c13 ON.

As described above, in the individual VCSEL operation method, a plurality of VCSELs may be operated individually. In the line-by-line operation method, rows of VCSELs may be operated sequentially or columns of VCSELs may be operated sequentially. In each of the methods, the operating sequences may vary.

By electrically controlling emission of VCSELs as described above, back side emitting light source array devices according to example embodiments may be employed in a scanner for scanning light or in a structured light projector. For example, light may be scanned by controlling VCSELs to sequentially emit light and controlling traveling direction of light by using the meta-surface layer 15. The structured light may be formed by controlling VCSELs to simultaneously emit light and forming patterned light by using the meta-surface layer 15. A three-dimensional image of a target object may be obtained by using a scanner or a structured light projector.

Figure 15:
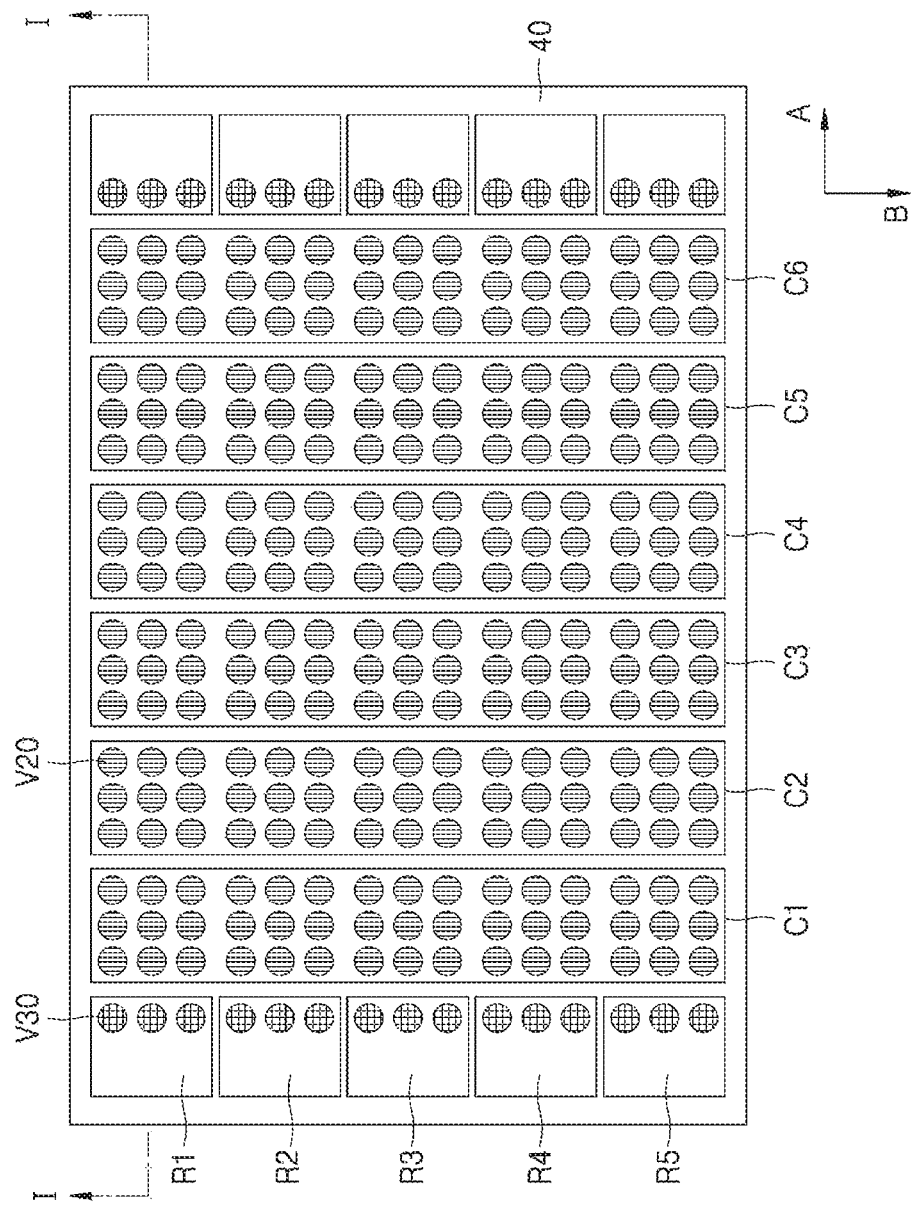
FIG. 15 is a schematic view of another example of a wiring structure of a back side emitting light source array device according to an example embodiment.

Next, FIG. 15 is a view of the wiring structure of a back side emitting light source array device according to another example embodiment.

Referring to FIG. 15, a plurality of first contact metal pattern groups R1 to R5 extending in the first direction (A direction) and a plurality of second contact metal pattern groups C1 to C6 extending in the second direction (B direction) intersecting the first direction (A direction) may be provided in the heat sink 40. The plurality of first contact metal row groups R1 to R5 may include a plurality of row wires in common, and the plurality of second contact metal column groups C1 to C6 may include a plurality of column wires in common. For example, the plurality of row wires included in the first contact metal row group R1 to R5 may operate as one cathode (one n-type contact layer), and the plurality of column wires included in the second contact metal column group may operate as one anode (one p-type contact layer). The number of the plurality of the first contact metal row groups R1 to R5, the number of the plurality of row wires included in the plurality of first contact metal row groups R1 to R5, the number of the plurality of second contact metal column groups C1 to C6, and the number of the plurality of column wires included in the plurality of second contact metal column groups C1 to C6 are merely examples and may vary. The plurality of VCSELs V20 may be disposed at points where the plurality of first contact metal pattern groups R1 to R5 and the plurality of second contact metal pattern groups C1 to C6 intersect. The dummy gain layers V30 may be provided in correspondence to the plurality of first contact metal pattern groups R1 to R5, respectively.

Figure 16:
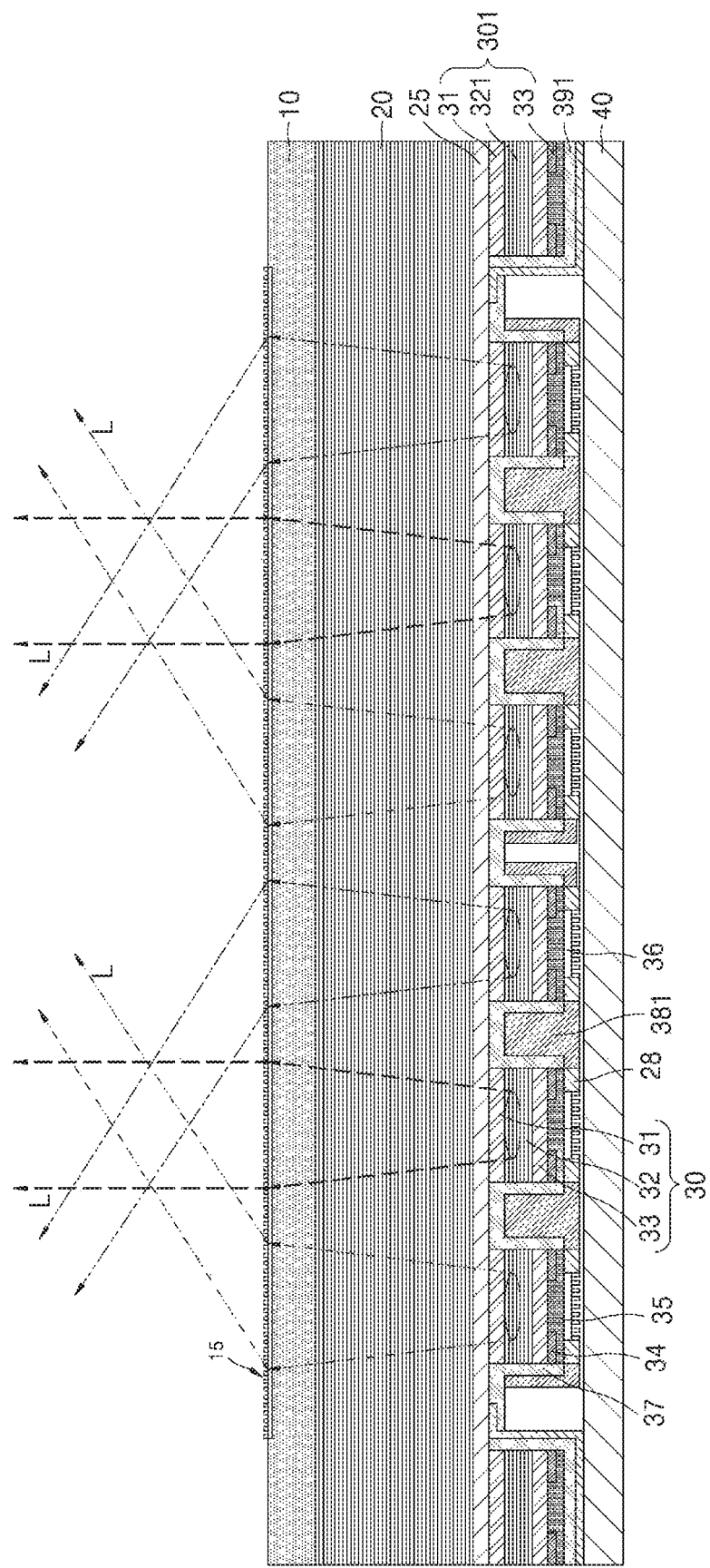
FIG. 16 is a cross-sectional view, taken along line I-I of FIG. 15.

FIG. 16 is a view of a back side emitting light source array device to which the wiring structure of FIG. 15 is applied. FIG. 16 shows a structure corresponding to a cross-section taken along the line I-I in FIG. 15. In FIG. 16, detailed descriptions of components denoted by the same reference numerals as those in FIG. 1 will be omitted. The gain layers 30 may be arranged as an n×m (n and m are natural numbers) matrix array, and a second contact metal 381, e.g., a p contact metal, may be provided in correspondence to two or more columns of gain layer groups in common. Also, the first contact layer 25, e.g., an n contact layer, and a first contact metal 391, e.g., an n contact metal, may be provided in correspondence to two or more rows of gain layer groups in common.

Referring to FIG. 16, the second contact metal 381 may have a structure corresponding to the gain layers 30 disposed in three columns in common. The first contact metal 391 may have a structure corresponding to the gain layers 30 disposed in three rows and dummy gain layers 301 disposed in three rows in common.

A method of operating a back side emitting light source array device shown in FIG. 15 will be described below.

An individual VCSEL group operation method is performed as VCSEL(1,1) Group ON: R1 ON and C1 ON, VCSEL(1,2) Group ON: R1 ON and C2 ON, . . . , VCSEL(5,6) Group ON: R5 ON and C6 ON. A line-by-line VCSEL group operation method is performed as follows: VCSEL(1 row Group) ON: R1 ON and C1~C6 ON, VCSEL(2 row Group) ON: R2 ON and C1~C6 ON, . . . , VCSEL(5 row Group) ON: R5 ON and C1~C6 ON. A line-by-line VCSEL group operation method is performed as follows: VCSEL(1 column Group) ON: R1~R5 ON and C1 ON, VCSEL(2 column Group) ON: R1~R5 ON and C2 ON, . . . , VCSEL(6 column Group) ON: R1~R5 ON and C6 ON.

In this way, the grouping of the row wire and the column wire may enable faster electric driving.

Figure 17:
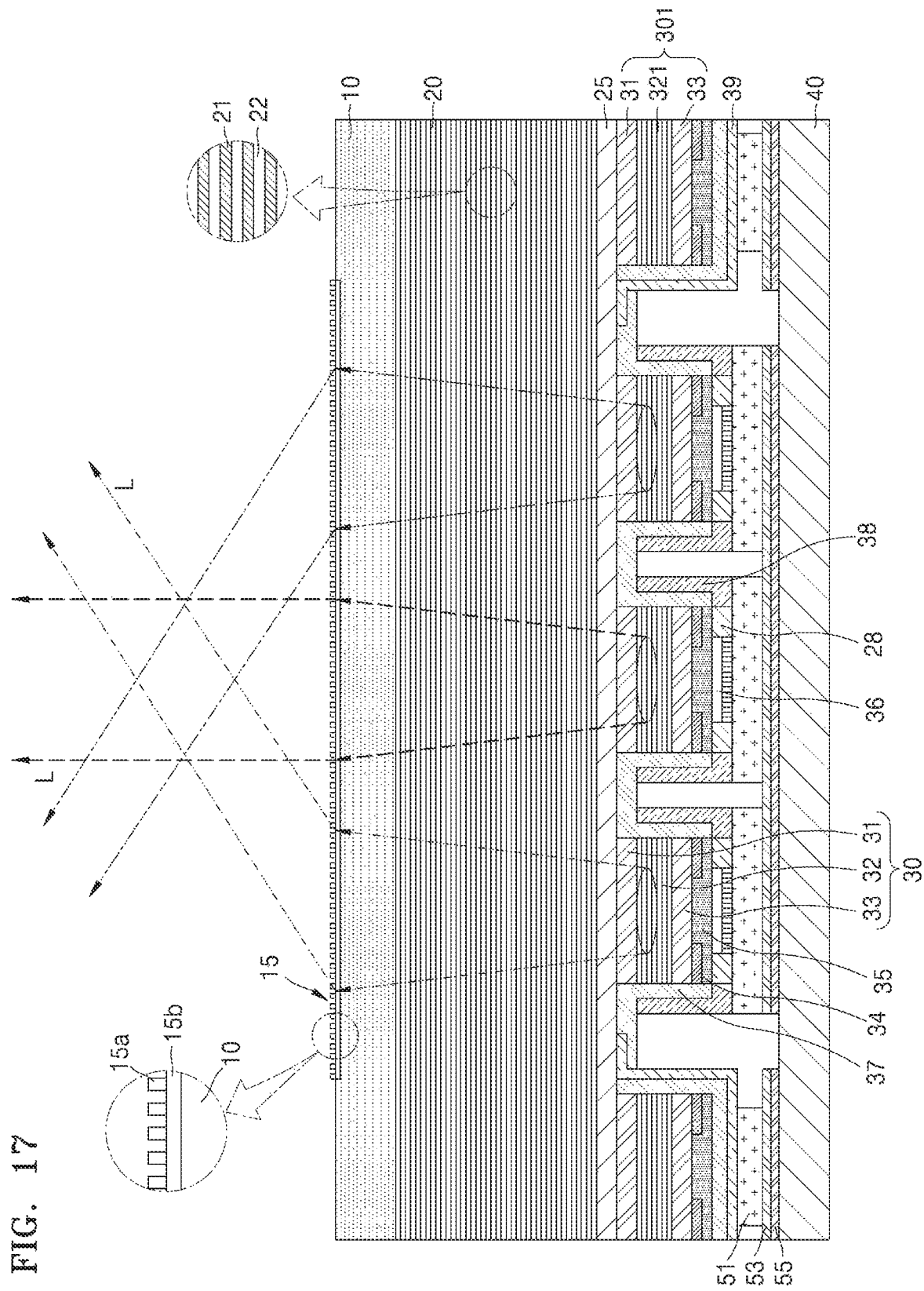
FIG. 17 is a view of a back side emitting light source array device according to another example embodiment.

FIG. 17 is a view of a back side emitting light source array device according to another example embodiment.

Referring to FIG. 17, the back side emitting light source array device of FIG. 17 differs from that of FIG. 1 in that at least one layer is further provided between the nanostructure reflector 36 and the heat sink 40. Only the difference will be described below with reference to FIG. 17, and descriptions of components denoted by the same reference numerals as those in FIG. 1 will be omitted.

A bonding layer 51 may further be provided between the nanostructure reflector 36 and the heat sink 40. The bonding layer 51 may include a metal. An insulation layer 53 may further be provided between the bonding layer 51 and the heat sink 40. Furthermore, a heat conduction layer 55 may further be provided between the insulation layer 53 and the heat sink 40. The heat conduction layer 55 may allow heat generated by VCSELs to be efficiently dissipated toward the heat sink 40.

Since a back side emitting light source array device according to example embodiments emits light through the substrate 10, the back side emitting light source array device may include the heat sink 40 having a wire structure coupled to the nanostructure reflector 36, and thus heat generated by VCSELs may be more efficiently discharged. Therefore, errors and deterioration of life span due to heat generation may be reduced or resolved. Furthermore, a back side emitting light source array device may be easily fabricated through a semiconductor process without limitation according to light emission direction. Furthermore, since VCSELs may contribute to miniaturization, improved operation speed, and reduction of power consumption of a back side emitting light source array device and diversify the optical properties of emitted light, the back side emitting light source array device including VCSELs may be employed in various fields including optical sensors and photonic integrated circuit (IC) systems and may also be applied to various other electronic apparatuses and optical apparatuses.

Figure 18:
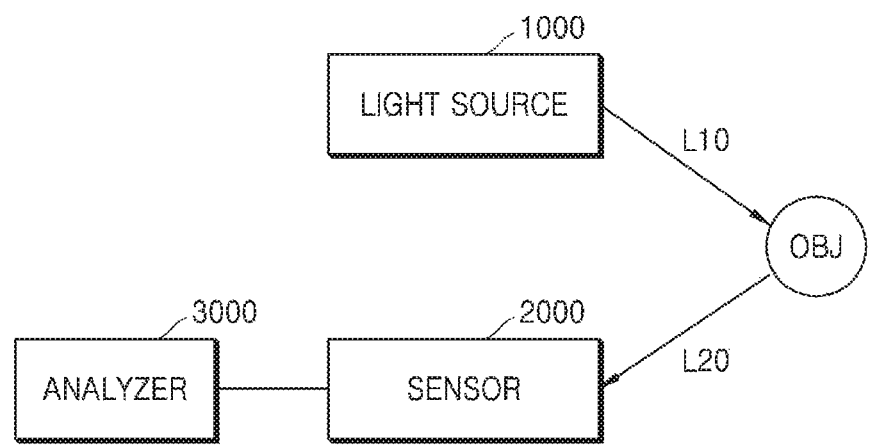
FIG. 18 is a schematic view of an electronic apparatus according to an example embodiment.

FIG. 18 is a block diagram showing a schematic structure of an electronic apparatus (optical apparatus) according to an embodiment.

Referring to FIG. 18, an electronic apparatus according to an example embodiment may include a light source 1000 that irradiates light L10 toward a target object OBJ and a sensor 2000 that detects light L20 emitted from the light source 1000 and modulated by the target object OBJ. Here, the light source 1000 may include a back side emitting light source array device according to example embodiments. Also, the electronic apparatus may further include an analyzer 3000 for analyzing light detected by the sensor 2000 and analyzing at least one of the physical property, the shape, the position, and the movement of the target object OBJ.

Between the light source 1000 and the target object OBJ, optical elements that perform additional operations like adjusting orientation of light generated by the light source 1000 toward the target object OBJ, adjusting the beam size, or modulating light into patterned light may be further arranged. When a meta-surface layer 15 (in FIG. 1) provided in the light source 1000 is suitably designed to perform such operations, such optical elements may be omitted. The sensor 2000 senses the light L20 modulated (reflected) by the target object OBJ. The sensor 2000 may include an array of light detecting elements. The sensor 2000 may further include a spectroscopic element for analyzing the light L20 modulated (reflected) by the target object OBJ by wavelengths.

The analyzer 3000 may analyze at least one of the physical properties, the shape, the position, and the movement of the target object OBJ by analyzing the light received by the sensor 2000. The 3D shape, the position, and the movement of the target object OBJ may be analyzed by comparing the pattern of the light L10 irradiated to the target object OBJ with the pattern of the light L20 reflected by the target object OBJ. The material property of the target object OBJ may be analyzed by analyzing the wavelength of light excited by the target object OBJ due to incident light, for example, the light L10.

The electronic apparatus according to the example embodiment may further include a controller for controlling the operation of the light source 1000 or the operation of the sensor 2000 and may further include a memory in which a calculation program for extraction of 3-dimensional information to be performed by the analyzer 3000 is stored. Information regarding a calculation result of the analyzer 3000, that is, the shape, the position, the material properties, etc. regarding the target object OBJ may be transmitted to another unit. For example, the information may be transmitted to a controller of a device in which the electronic apparatus is employed.

The electronic apparatus according to an example embodiment may also be used as a sensor for precisely obtaining 3-dimensional information regarding a front object, and thus the electronic apparatus may be employed in various devices. Such devices may include, for example, autonomous operating devices like an unmanned vehicle, an autonomous driving vehicle, a robot, and a drone and may also include augmented reality devices, mobile communication devices, Internet of Things (IOT) devices, etc.

The configuration of the electronic apparatus (optical apparatus) described with reference to FIG. 17 is merely an example, and a back side emitting light source array device according to example embodiments may be applied to various electronic apparatuses (optical apparatuses). A back side emitting light source array device may be applied to various fields like imaging devices, projectors, scanners, and sensors.

Back side emitting light source array devices of the example embodiments may be employed in various electronic apparatuses for illuminating a target object through a display panel.

Figure 19:
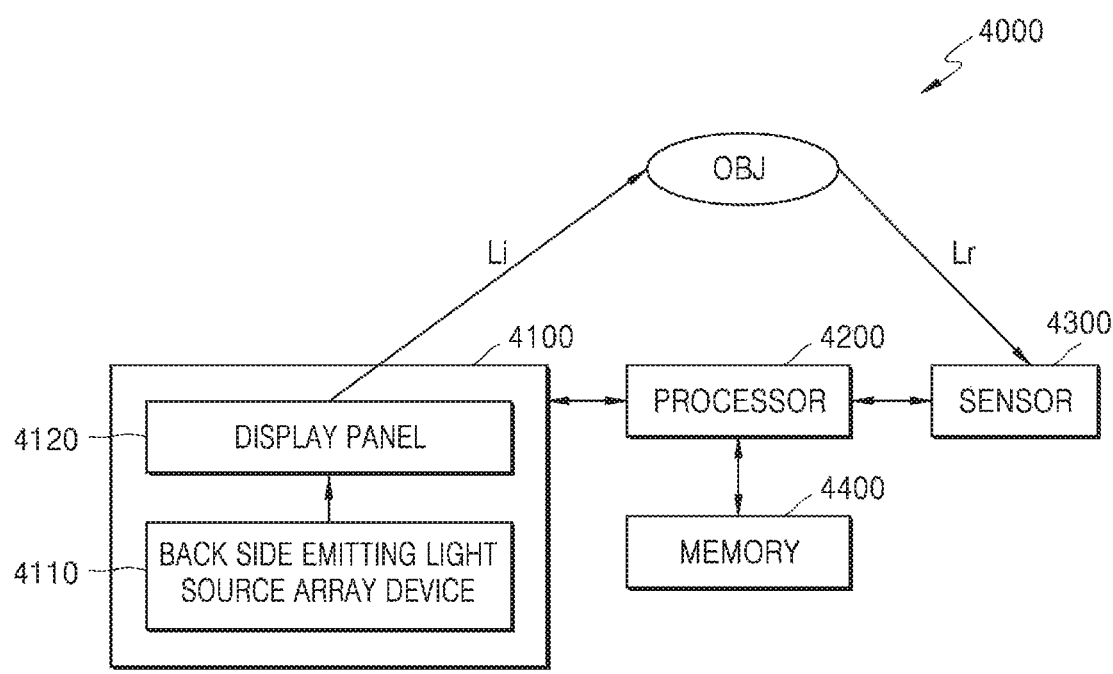
FIG. 19 is a schematic view of an electronic apparatus according to another example embodiment.

FIG. 19 is a block diagram showing a schematic configuration of an electronic device according to an example embodiment.

An electronic apparatus 4000 may include a display 4100 that radiates light Li toward the target object OBJ, a sensor 4300 that receives light Lr reflected by the target object OBJ, and a processor 4200 that performs a calculation for obtaining information regarding the target object OBJ from the light received from the sensor 4300. The display 4100 may include a back side emitting light source array device 4110 for irradiating light and a display panel 4120 for displaying an image.

The electronic device 4000 may also include a memory 4400 in which code or data for the calculation of the processor 4200 is stored.

Light L emitted from the back side emitting light source array device 4110 may illuminate the target object OBJ through a transmission window of the display panel 4120.

The back side emitting light source array device 4110 may illuminate or scan the target object OBJ with structured light. The sensor 4300 senses the light Lr reflected by the target object OBJ. The sensor 4300 may include an array of light detecting elements. The sensor 4300 may further include a spectroscopic element for analyzing light reflected by the target object OBJ by wavelengths.

The processor 4200 performs a calculation for obtaining information regarding the target object OBJ from light received from the sensor 4300 and may also manage processing and control of the entire electronic apparatus 4000. The processor 3200 may obtain and process information regarding the target object OBJ, e.g., two-dimensional or three-dimensional image information, and may also control the operation of the back side emitting light source array device 4110 the operation of the sensor 4300 overall. The processor 4200 may also determine whether a user is authenticated or the like based on information obtained from the target object OBJ and may also execute other applications.

The memory 4400 may store a code for execution in the processor 4200 and may also store various execution modules to be executed by the electronic apparatus 4000 and data therefor. For example, the memory 4400 may store program code used by the processor 4200 for an calculation for obtaining information regarding the target object OBJ and code like application modules that may be executed by using the information regarding the target object OBJ. Also, the memory 4400 may further store a communication module, a camera module, a moving image playback module, an audio playback module, and the like as programs for operating devices that may be additionally provided in the electronic device 4000.

A result of an calculation by the processor 4200, that is, information regarding the shape and the position of the target object OBJ, may be transmitted to another device or another unit as occasions demand. For example, information regarding the target object OBJ may be transmitted to a controller of another electronic device using the information regarding the target object OBJ. The other unit to which a result of an calculation is transmitted may be a display device or a printer that outputs the result. In addition, the other unit may be, but is not limited to, a smartphone, a mobile phone, a personal digital assistant (PDA), a laptop personal computer (PC), a desktop PC, various wearable devices, and other mobile or stationary computing devices.

The memory 4400 may include at least one type of storage medium from among a flash memory, a hard disk, a multimedia card micro, a card type memory (e.g., an SD or XD memory), random access memory (RAM), static RAM (SRAM), a read-only memory (ROM), electrically erasable programmable ROM (EEPROM), programmable ROM (PROM), a magnetic memory, a magnetic disk, an optical disk, etc.

For example, the electronic device 4000 may be, but is not limited to, a portable mobile communication device, a smart phone, a smartwatch, a PDA, a laptop PC, a desktop PC, and other mobile or stationary computing devices. The electronic device 4000 may be an autonomously operating device like an unmanned vehicle, an autonomous driving vehicle, a robot, and a drone or an Internet-of-Things (IoT) device.

Figure 20:
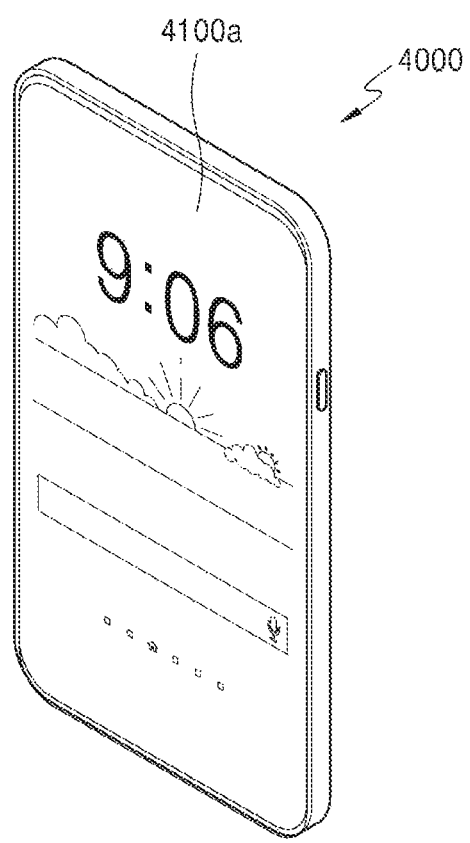
FIG. 20 is a perspective view of an example appearance of the electronic apparatus of FIG. 19.

FIG. 20 is a perspective view of an example of the electronic apparatus of FIG. 19.

As shown in FIG. 20, the electronic device 4000 may employ a full-screen display type display. For example, the electronic device 4000 may be a bezel-less type in which a display surface 4100a occupies almost the entire region of the front surface of the electronic device 4000. Also, the shape of the display surface 4100a may be a rectangular shape without a notch.

As described above, a back side emitting light source array device according to example embodiments may be disposed on the rear surface of a display panel and illuminate the front surface of the display panel through a transmitting window uniformly distributed throughout a display surface or a transmitting window formed in one region having a certain size. Therefore, a bezel-less and notch-free display as shown in FIG. 16 may be applied to the electronic device 4000.

The implementations described in example embodiment are illustrative and do not in any way limit the scope of the present disclosure. For clarity of description, descriptions of conventional electronic configurations, control systems, software, and other functional aspects of such systems may be omitted. Also, connections of lines or connecting members between the components shown in the drawings are example illustrations of functional connections and/or physical or circuit connections, which may be replaced with or additionally provided by various functional connections, physical connections, or circuit connections.

It should be understood that example embodiments described herein should be considered in a descriptive sense only and not for purposes of limitation. Descriptions of features or aspects within each example embodiment should typically be considered as available for other similar features or aspects in other embodiments.

While example embodiments have been described with reference to the figures, it will be understood by those of ordinary skill in the art that various changes in form and details may be made therein without departing from the spirit and scope as defined by the following claims.

What is claimed is:

1. A back side emitting light source array device comprising:
    a substrate;
    an array of vertical cavity surface emitting lasers (VCSELs) configured to emit light toward the substrate;

a distributed Bragg reflector (DBR) provided on a first surface of the substrate;

a plurality of gain layers which are provided on the DBR, the plurality of gain layers being spaced apart from one another, and each of the plurality of gain layers being configured to individually generate light; and a nanostructure reflector provided on the plurality of gain layers opposite to the DBR, the nanostructure reflector comprising a plurality of nanostructures having a sub-wavelength shape dimension, wherein the DBR, the plurality of gain layers, and the plurality of nanostructures constitute the VCSELs of the array of VCSELs, wherein the DBR is provided in a common mirror layer for the plurality of gain layers which are provided in an array, wherein the nanostructure reflector is provided on each of the plurality of gain layers, and wherein a reflectivity of the DBR is less than a reflectivity of the nanostructure reflector such that the light generated is emitted through the substrate.

2. The back side emitting light source array device of claim 1, further comprising:

a meta-surface layer provided on a second surface of the substrate opposite to the first surface.

3. The back side emitting light source array device of claim 2, wherein the meta-surface layer comprises a meta lens, a meta-prism, or a meta-diffractive element.

4. The back side emitting light source array device of claim 2, wherein the meta-surface layer has sub-wavelength dimensions and comprises a nanostructure with a refractive index that is greater than a reflective index of a material provided around the nano structure.

5. The back side emitting light source array device of claim 2, wherein at least one of a thickness, a width, and an arrangement pitch of each of the plurality of nanostructures of the nanostructure reflector is less than or equal to half of wavelength of the light, wherein the meta-surface layer comprises a plurality of nanostructures, and wherein at least one of a thickness, a width, and an arrangement pitch of each of the plurality of nanostructures of the meta-surface layer is less than or equal to two-thirds of the wavelength of the light.

6. The back side emitting light source array device of claim 1, further comprising:

a heat sink provided on the nanostructure reflector opposite to the plurality of gain layers.

7. The back side emitting light source array device of claim 1, wherein the substrate comprises a group III-V semiconductor substrate.

8. A back side emitting light source array device comprising:

a substrate;

a distributed Bragg reflector (DBR) provided on a first surface of the substrate;

a plurality of gain layers which are provided on the DBR, the plurality of gain layers being spaced apart from one another, and each of the plurality of gain layers being configured to individually generate light; and a nanostructure reflector provided on the plurality of gain layers opposite to the DBR, the nanostructure reflector comprising a plurality of nanostructures having a sub-wavelength shape dimension, wherein a reflectivity of the DBR is less than a reflectivity of the nanostructure reflector such that the light generated is emitted through the substrate, and wherein a p contact layer is provided on the nanostructure reflector and a p contact metal is provided on the p contact layer.

9. The back side emitting light source array device of claim 8, wherein the plurality of gain layers are provided in an n×m matrix array, where n and m are natural numbers, and the p contact metal is correspondingly provided to overlap two or more columns the n×m matrix array of the plurality of gain layers.

10. The back side emitting light source array device of claim 8, further comprising an aperture layer provided on the p contact metal.

11. The back side emitting light source array device of claim 10, further comprising an insertion layer provided on the aperture layer.

12. The back side emitting light source array device of claim 1, further comprising an n contact layer provided between the DBR and the plurality of gain layers.

13. The back side emitting light source array device of claim 12, further comprising:

dummy gain layers which do not generate light; and n contact metals supported by the dummy gain layers provided at both ends of the DBR, the n contact metals being connected to the n contact layer.

14. The back side emitting light source array device of claim 13, wherein the plurality of gain layers are provided in an n×m matrix array, n and m being natural numbers, and the n contact layer and the n contact metals are correspondingly provided to overlap two or more rows of the n×m matrix array of the plurality of gain layers.

15. The back side emitting light source array device of claim 6, further comprising wires provided on the heat sink.

16. The back side emitting light source array device of claim 6, further comprising bonding layers provided between the nanostructure reflector and the heat sink.

17. The back side emitting light source array device of claim 6, further comprising a heat conduction layer provided between the nanostructure reflector and the heat sink.

18. The back side emitting light source array device of claim 1, further comprising:

a p contact layer provided on the nanostructure reflector;

an n contact layer provided between the DBR and the plurality of gain layers; and an insulating protection layer provided between the p contact layer and the n contact layer.

19. An electronic apparatus comprising:

a back side emitting light source array device configured to radiate light to a target object;

a sensor configured to receive light reflected from the target object; and a processor configured to obtain information regarding the target object based on light received by the sensor, wherein the back side emitting light source array device comprises:

a substrate;

an array of vertical cavity surface emitting lasers (VCSELs) configured to emit light toward the substrate;

a distributed Bragg reflector (DBR) provided on a first surface of the substrate;

a plurality of gain layers which are provided on the DBR, the plurality of gain layers being spaced apart from one another, and each of the plurality of gain layers being configured to configured to individually generate light; and a nanostructure reflector provided on the plurality of gain layers opposite to the DBR, the nanostructure reflector comprising a plurality of nanostructures having a sub-wavelength shape dimension, wherein the DBR, the plurality of gain layers and the plurality of nanostructures constitute the VCSELs of the array of VCSELs, wherein the DBR is provided in a common mirror layer for the plurality of gain layers which are provided in an array, wherein the nanostructure reflector is provided on each of the plurality of gain layers, and wherein a reflectivity of the DBR is less than a reflectivity of the nanostructure reflector such that light is emitted through the substrate.

20. The electronic apparatus of claim 19, further comprising a meta-surface layer provided on second surface of the substrate opposite to the first surface.

21. The electronic apparatus of claim 19, further comprising a heat sink provided on the nanostructure reflector.

22. The electronic apparatus of claim 19, further comprising:
a p contact layer provided on the nanostructure reflector; and
a p contact metal provided on the p contact layer.

23. The electronic apparatus of claim 22, wherein the plurality of gain layers are provided in an n×m matrix array, n and m being natural numbers, and the p contact metal is correspondingly provided to overlap two or more columns of the n×m matrix array of the plurality of gain layers.

24. An electronic apparatus comprising:
a back side emitting light source array device configured to radiate light to a target object;
a sensor configured to receive light reflected from the target object; and
a processor configured to obtain information regarding the target object based on light received by the sensor,
wherein the back side emitting light source array device comprises:
a substrate;
a distributed Bragg reflector (DBR) provided on a first surface of the substrate;
a plurality of gain layers which are provided on the DBR, the plurality of gain layers being spaced apart from one another, and each of the plurality of gain layers being configured to configured to individually generate light;
an n contact layer provided between the DBR and the plurality of gain layers; and
a nanostructure reflector provided on the plurality of gain layers opposite to the DBR, the nanostructure reflector comprising a plurality of nanostructures having a sub-wavelength shape dimension, and
wherein a reflectivity of the DBR is less than a reflectivity of the nanostructure reflector such that light is emitted through the substrate.

25. The electronic apparatus of claim 24, further comprising:
dummy gain layers which do not generate light; and
n contact metals supported by the dummy gain layers provided at both ends of the DBR, the n contact metals being connected to the n contact layer.

26. The electronic apparatus of claim 25, wherein the plurality of gain layers are provided in an n×m matrix array, n and m being natural numbers, and the n contact layer and the n contact metals are correspondingly provided to overlap two or more rows of the n×m matrix array of the plurality of gain layers.

* * * * *